(12) United States Patent
Crawford et al.

(10) Patent No.: US 9,153,547 B2
(45) Date of Patent: Oct. 6, 2015

(54) INTEGRATED INDUCTOR STRUCTURE AND METHOD OF FABRICATION

(75) Inventors: Ankur Mohan Crawford, New York, NY (US); Henning Braunisch, Chandler, AZ (US); Rajendran Nair, Gilbert, AZ (US); Gilroy Vandentop, Tempe, AZ (US); Shan X. Wang, Portola Valley, CA (US)

(73) Assignee: Intel Corporation, Santa Clara, CA (US)

( * ) Notice: Subject to any disclaimer, the term of this patent is extended or adjusted under 35 U.S.C. 154(b) by 1001 days.

(21) Appl. No.: 12/428,430

(22) Filed: Apr. 22, 2009

(65) Prior Publication Data

US 2009/0201113 A1  Aug. 13, 2009

Related U.S. Application Data

(62) Division of application No. 10/975,552, filed on Oct. 27, 2004, now abandoned.

(51) Int. Cl.
| | |
|---|---|
| H01F 5/00 | (2006.01) |
| H01F 27/28 | (2006.01) |
| H01L 27/08 | (2006.01) |
| H01F 7/06 | (2006.01) |
| H01L 23/64 | (2006.01) |
| H01F 17/00 | (2006.01) |
| H01F 41/04 | (2006.01) |

(Continued)

(52) U.S. Cl.
CPC .......... *H01L 23/645* (2013.01); *H01F 17/0033* (2013.01); *H01F 41/046* (2013.01); *H01L 23/49822* (2013.01); *H01L 28/10* (2013.01); *H05K 1/0373* (2013.01); *H05K 1/165* (2013.01); *H01L 2224/16* (2013.01); *H01L 2224/16235* (2013.01); *H01L 2924/01077* (2013.01); *H01L 2924/01078* (2013.01); *H01L 2924/15311* (2013.01); *H01L 2924/15312* (2013.01); *H01L 2924/3011* (2013.01); *H05K 3/4644* (2013.01); *H05K 2201/086* (2013.01); *H05K 2201/09563* (2013.01)

(58) Field of Classification Search
USPC ................... 336/200, 232; 257/531; 29/602.1
See application file for complete search history.

(56) References Cited

U.S. PATENT DOCUMENTS

| | | |
|---|---|---|
| 4,326,180 A | 4/1982 | Ferri |
| 4,969,032 A | 11/1990 | Scheitlin et al. |

(Continued)

FOREIGN PATENT DOCUMENTS

| | | |
|---|---|---|
| JP | 58-079706 | 5/1983 |
| JP | 01-253906 | 10/1989 |

(Continued)

OTHER PUBLICATIONS

Prismark LLC, "Power Demands in High-end Microprocessors", Feb. 2002, http://www.incep.com/documents/Power_Demands_HghEn_Prismark.PDF.

(Continued)

*Primary Examiner* — Tsz Chan
(74) *Attorney, Agent, or Firm* — Blakely, Sokoloff, Taylor & Zafman LLP

(57) ABSTRACT

An inductor structure comprised of a magnetic section and a single turn solenoid. The single turn solenoid to contain within a portion of the magnetic section and circumscribed by the magnetic section.

17 Claims, 9 Drawing Sheets

(51) Int. Cl.
  *H01L 23/498*    (2006.01)
  *H01L 49/02*     (2006.01)
  *H05K 1/03*      (2006.01)
  *H05K 1/16*      (2006.01)
  *H05K 3/46*      (2006.01)

(56) References Cited

U.S. PATENT DOCUMENTS

| | | | | |
|---|---|---|---|---|
| 5,568,111 | A | * | 10/1996 | Metsler ............ 336/65 |
| 5,621,635 | A | * | 4/1997 | Takiar ............ 363/141 |
| 5,849,355 | A | | 12/1998 | McHenry |
| 6,060,977 | A | * | 5/2000 | Yamamoto et al. ........ 336/212 |
| 6,076,253 | A | | 6/2000 | Takayama et al. |
| 6,104,272 | A | | 8/2000 | Yamamoto et al. |
| 6,180,445 | B1 | | 1/2001 | Tsai |
| 6,189,202 | B1 | | 2/2001 | Masuda et al. |
| 6,310,386 | B1 | | 10/2001 | Shenoy |
| 6,323,533 | B1 | * | 11/2001 | Van Der Zaag et al. ...... 257/528 |
| 6,355,491 | B1 | * | 3/2002 | Zhou et al. ............ 436/518 |
| 6,414,582 | B1 | | 7/2002 | Brkovic et al. |
| 6,483,413 | B1 | | 11/2002 | Maeda et al. |
| 6,498,553 | B1 | | 12/2002 | Tanaka et al. |
| 6,700,472 | B2 | | 3/2004 | Wang et al. |
| 6,713,375 | B2 | | 3/2004 | Shenoy |
| 6,791,158 | B2 | | 9/2004 | Lemaire |
| 6,815,220 | B2 | | 11/2004 | Crawford et al. |
| 7,119,448 | B1 | | 10/2006 | de Stasi |
| 7,446,638 | B2 | | 11/2008 | Nogi |
| 2002/0003281 | A1 | * | 1/2002 | Ibata et al. ............ 257/531 |
| 2002/0041216 | A1 | * | 4/2002 | Welland et al. .......... 331/117 R |
| 2002/0067234 | A1 | * | 6/2002 | Kung ............ 336/192 |
| 2003/0081389 | A1 | | 5/2003 | Nair et al. |
| 2009/0091414 | A1 | | 4/2009 | Hopper et al. |
| 2009/0094818 | A1 | | 4/2009 | Smeys et al. |

FOREIGN PATENT DOCUMENTS

| | | |
|---|---|---|
| JP | 01-290210 | 11/1989 |
| JP | 02-112209 | 4/1990 |
| JP | 02-310905 | 12/1990 |
| JP | 04-280407 | 10/1992 |
| JP | 04-373106 | 12/1992 |
| JP | 06-176928 | 6/1994 |
| JP | 07-130541 | 5/1995 |
| JP | 08-264324 | 10/1996 |
| JP | 08-293415 | 11/1996 |
| JP | 2004-343036 | 12/2004 |
| JP | 08-069919 A | 4/2009 |

OTHER PUBLICATIONS

Mahajan, Raj Nair et al. "Emerging Directions for Packaging Technologies", ITJ vol. 6, Issue 2, Published May 16, 2002, http://www.intel.com/technology/itj/2002/volume02issue02/art07_emergingdirections/p01_abstract.

Jae Y. Park et al., "Packaging Compatible Microtransformers on a Silicon Substrate", IEEE Transactions on Advanced Packaging, vol. 26, No. 2, May 2003, pp. 160-164.

Office Communication mailed May 31, 2007, U.S. Appl. No. 10/975,552, filed Oct. 27, 2004.

Office Communication mailed Jan. 3, 2008, U.S. Appl. No. 10/975,552, filed Oct. 27, 2004.

Office Communication mailed May 12, 2008, U.S. Appl. No. 10/975,552, filed Oct. 27, 2004.

Office Communication mailed Jan. 23, 2009, U.S. Appl. No. 10/975,552, filed Oct. 27, 2004.

Office Communication mailed Apr. 30, 2009, U.S. Appl. No. 11/554,567, filed Oct. 30, 2006.

* cited by examiner

INTEGRATED INDUCTOR STRUCTURE AND METHOD OF FABRICATION

This is a Divisional application of Ser. No. 10/975,552 filed Oct. 27, 2004, now abandoned.

BACKGROUND OF THE INVENTION

1. Field of the Invention

The present invention relates to the field of semiconductor devices and more specifically to an integrated inductor structure and its method of fabrication.

2. Discussion of Related Art

The need for inductors in semiconductor design dictates the use of discrete inductors or spiral inductors. The discrete inductor is in an off-chip, off-package configuration and requires long interconnects to connect the inductor to the chip. These interconnects have high impedances and result in large ohmic losses. Also, discrete inductors require extra space outside the chip package, which is difficult to provide for in high-density circuit board fabrication.

Spiral inductors are created through windings of metal thin films, usually on a silicon substrate. The first drawback of spiral inductors includes the large area necessary to create large inductances. Another drawback of spiral inductors includes the tendency of the inductors to have high resistances. This high resistance deteriorates the quality factor of the inductors making them too lossy for such applications as power delivery. Furthermore, spiral inductors force the magnetic flux into the silicon substrate causing both eddy current losses and interference with devices.

SUMMARY

An inductor structure comprised of a magnetic section and a single turn solenoid. The single turn solenoid to contain within a portion of the magnetic section and circumscribed by the magnetic section.

BRIEF DESCRIPTION OF THE DRAWINGS

FIG. 5e' is an illustration of an overhead view of formed trench regions in a magnetic layer for forming an inductor structure.

DETAILED DESCRIPTION

In the following description numerous specific details are set forth in order to provide an understanding of the claims. One of ordinary skill in the art will appreciate that these specific details are not necessary in order to practice the disclosure. In other instances, well-known semiconductor fabrication processes and techniques have not been set forth in particular detail in order to not unnecessarily obscure the present invention.

Figure 1A:
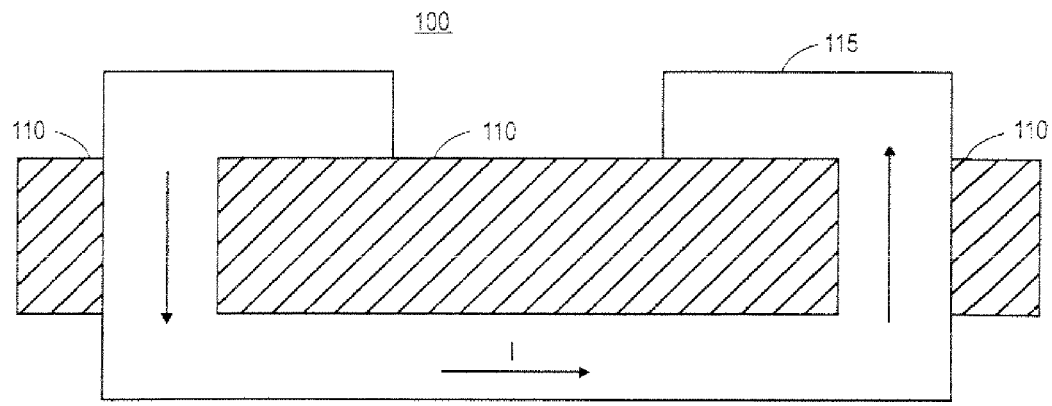
FIG. 1a is an illustration of a cross-sectional view of an embodiment of the inductor structure.
Figure 1B:
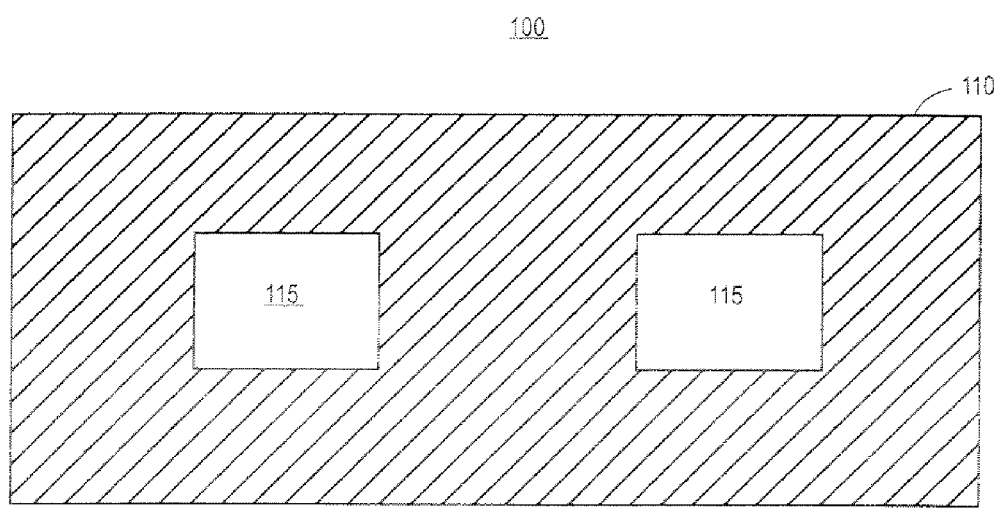
FIG. 1b is an illustration of an overhead view of an embodiment of the inductor structure.

The present invention is an integrated inductor structure 100 and its method of fabrication. In an embodiment, the integrated inductor structure 100, as shown in FIG. 1a and FIG. 1b, is a solenoid structure 115 with a single turn that is filled with and is surrounded by magnetic material 110. The magnetic material 110 enables a reduction of the inductor size because the magnetic material 110 has a relative magnetic permeability greater than one[HB1]. This results in a higher inductance per area than an inductor without magnetic material. In an embodiment of the inductor structure 100, the area can be about 0.01-9 mm$^2$ with an inductance in the nanohenry (nH) range. The dimensions of the structure of the inductor can be altered to meet specific inductance and area requirements.

Another benefit of the magnetic material 110 is the encapsulation of the magnetic flux within the plane of the inductor structure 100, leading to a reduction of interference with surrounding components. In an embodiment, the single turn solenoid structure of the present invention enables an inductor with a low resistance. The low resistance and the capability of the inductor of the present invention to provide inductances in the nanohenry range permit the use of the inductor in applications such as power delivery for integrated circuits.

Figure 2A:
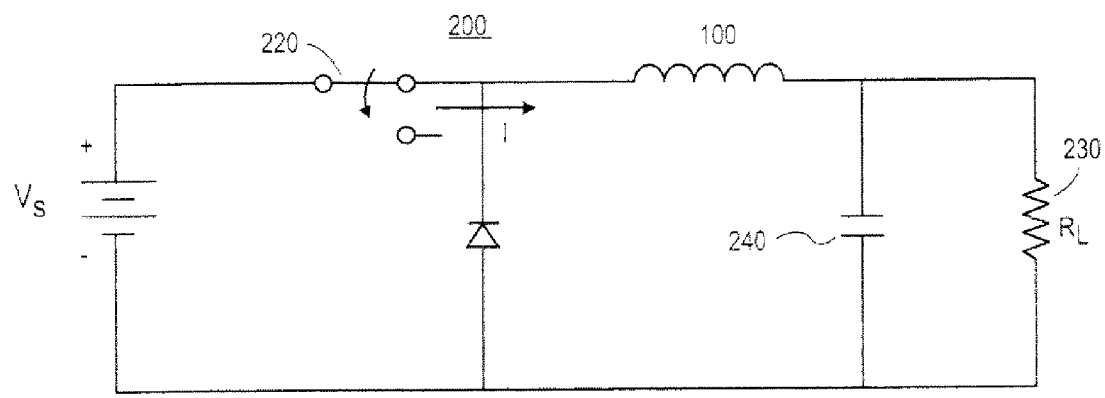
FIG. 2a is a circuit diagram of an embodiment of a buck converter circuit with the switch in the on position.
Figure 2B:
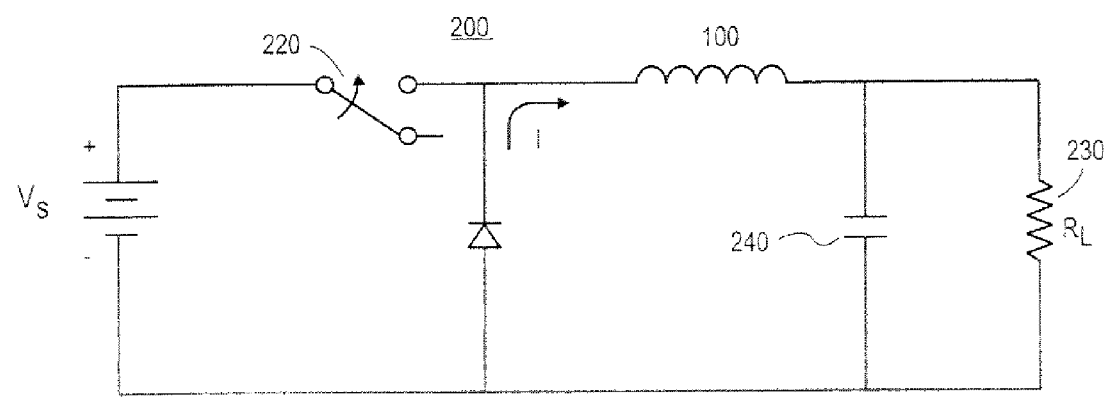
FIG. 2b is a circuit diagram of an embodiment of a buck converter circuit with the switch in the off position

One such power application includes the use in a buck converter circuit 200 as shown in FIGS. 2a and 2b. In the buck converter circuit 200 the inductor structure 100 and the capacitor 240 act as energy storage devices when the switch 220 is in the on position as shown in FIG. 2a. Once the switch 220 is placed in the off position, as shown in FIG. 2b, the inductor structure 100 acts like a source and works to maintain the current through the load resistor 230. Similarly, the capacitor 240 works to maintain the voltage across the load resistor 230.

In the embodiment of FIG. 1a, the layer of magnetic material 110 is formed around and within a conductive material 115 in a single loop configuration. The conductive material 115 can be formed from such materials including copper, tungsten, or aluminum. FIG. 1b shows the overhead view of one embodiment where the magnetic material 110 surrounds the conductive material 115 in the longitudinal plane of the inductor structure 100. In an embodiment the inductor structure 100 can be formed having an area of 0.11 mm$^2$ with a resistance less than 10 mΩ and an inductance of 10.1 nH. An embodiment of the inductor structure 100 can have a magnetic material 110 with the height of approximately 20-30 microns. This embodiment includes a conductive material 115 in the single loop configuration with a length of approximately 200-1000 microns, a width of approximately 350-450 microns, and a thickness of the conductive material 115 of approximately 20 microns.

In one embodiment the magnetic material 110 is composed of a soft magnetic material. Soft magnetic materials are easily magnetized and demagnetized. These properties make soft magnetic materials useful for enhancing or channeling flux produced by an electric current. One parameter used to distinguish soft magnetic materials is the relative permeability. The relative permeability indicates the amount of magnetic flux density in a material over that contained in a vacuum when in the presence of a magnetic force. In an embodiment of the inductor structure 100, the relative permeability is approximately 95-900. Generally, the relative permeability of an embodiment of the inductor structure 100 is approximately 100-500 and typically approximately 300. As mentioned earlier, materials with magnetic properties are used because the high permeability creates an increased magnetic flux resulting in a higher inductance over inductors without material with magnetic properties. In some embodiments of the inductor structure 100, the magnetic material 110 is a magneto-dielectric such as CoFHfO. The magneto-dielectric in another embodiment is formed from magnetic nanoparticles embedded into a dielectric material. In one embodiment nanoparticles can be distributed throughout a host material such as a polymer host.

Figure 3:
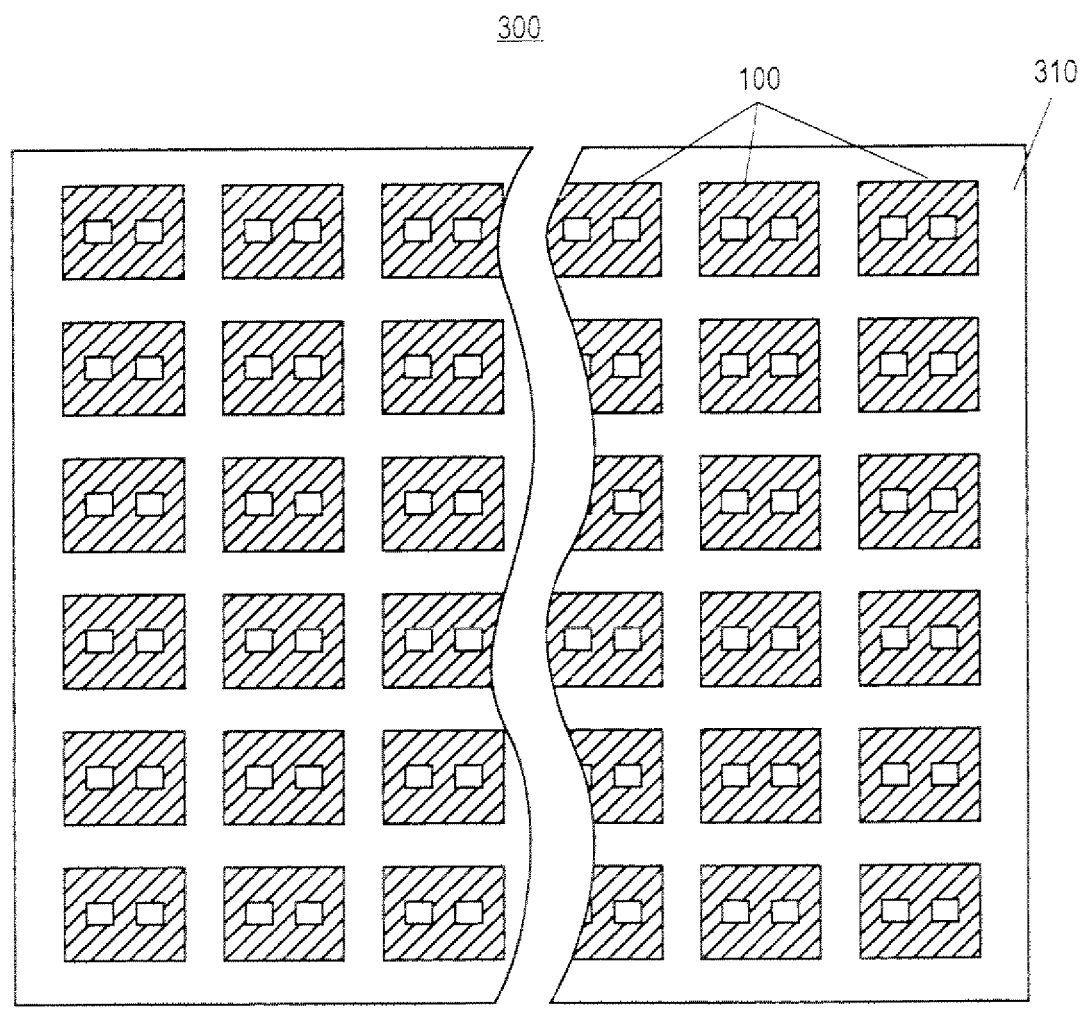
FIG. 3 is an illustration of an overhead view of an array of inductors.

As shown in FIG. 3, an embodiment of the inductor structure 100 includes fabrication of an inductor array 300 formed from a predetermined number of the inductor structures of the present invention. In such an array, a dielectric material 310, including an Ajinomoto buildup film (ABF); a ceramic; or a solder resist, can be used to separate an inductor structure 100 from one another within the inductor array 300. One embodiment of an inductor array 300 can include approximately 9-10,000 inductor structures of the present invention.

In an inductor array 300 embodiment, the inductor structure 100 can be connected to another inductor structure 100 in series, in parallel, and/or to devices external to the array. Series connections of an inductor structure 100 can be used to create inductance values equal to the sum of the inductors connected in series. Also, the inductor structure 100 in the inductor array 300 can be connected to another inductor structure 100 in parallel to tune the effective inductance of the combined inductor structure 100 connected together to a certain predetermined inductance. An individual inductor structure 100 in the inductor array 300, a combination of serially connected inductor structures 100, a combination of inductor structures 100 connected in parallel, or a combination of inductor structures 100 connected in series and in parallel can be used to connect to devices external to the inductor array 300. Examples of devices external to the inductor array 300 that could be connected to the inductor structure 100 include capacitors, voltage regulator modules, resistors, transistors and other devices useful in electronic design. Embodiments of the inductor array 300 can have the inductor structure 100 orientated on its side, upside down, or in other positions.

Figure 4:
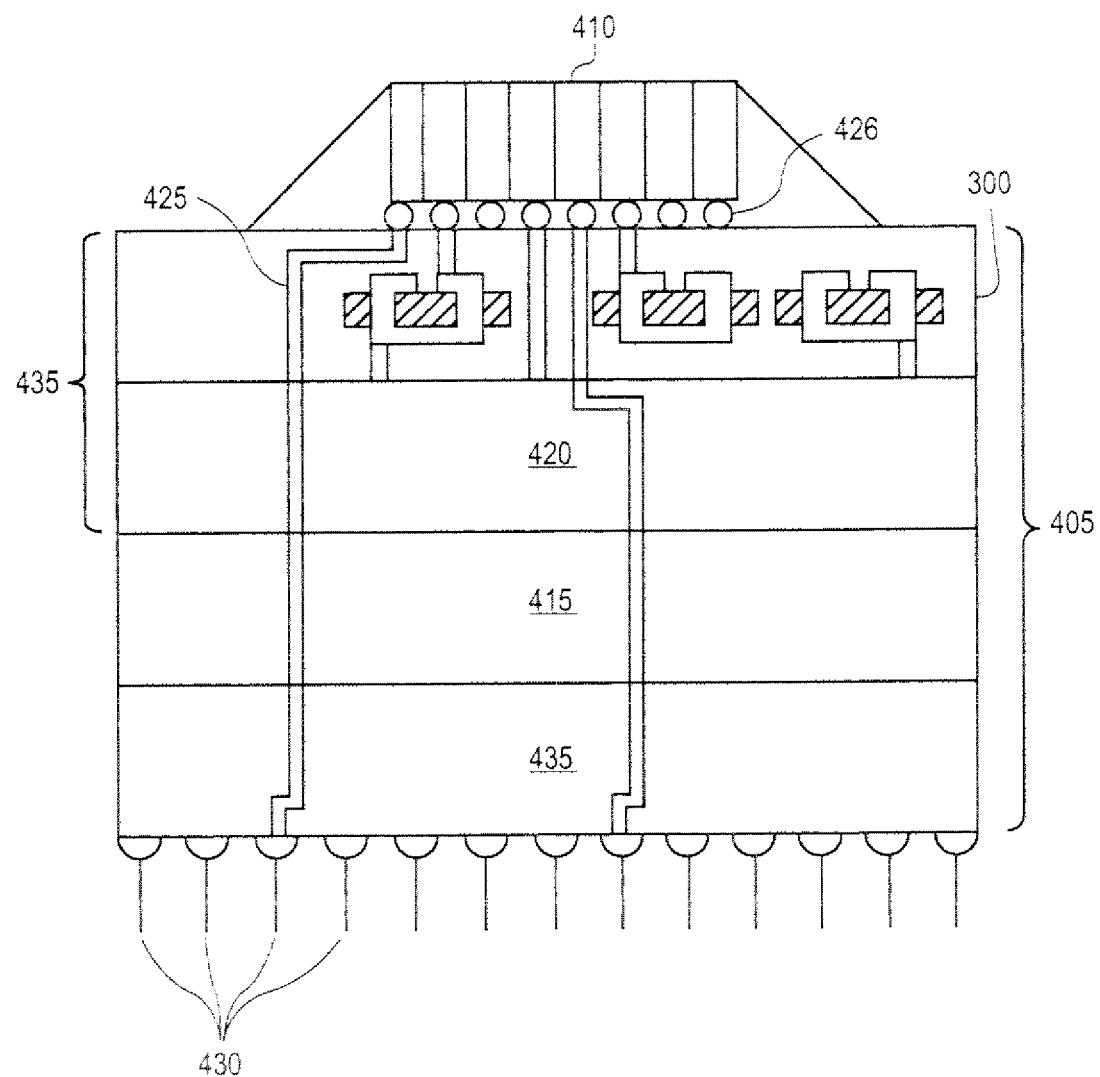
FIG. 4 is an illustration of a cross-sectional view of an inductor structure incorporated into the build-up packaging layers of an integrated circuit package.

As shown in FIG. 4[HB2], one embodiment of the inductor structure 100, such as an inductor array 300, can be fabricated into a build-up layer 435 of an integrated circuit package substrate 405. This build-up layer 435 could contain passive components including parallel-plate capacitors to form part of a power converter, such as a buck converter circuit 200. An embodiment of an inductor structure 100 in an inductor array 300 or a combination of connected inductors contained in an inductor array 300 contained within a build-up layer 435 can be used in conjunction with an array of voltage regulator modules (VRMs) 420 incorporated into a separate build-up layer 435. Such an embodiment can be used as a part of a power conversion circuit, such as a buck converter circuit 200, to power a die 410. [HB3] One embodiment positions the inductor array 300 between a die 410 and an array of VRMs 420 as illustrated in FIG. 4. The voltage regulator elements of a build-up layer 435[HB4] convert a higher supply voltage to a lower voltage that is then coupled to the power and of the die 410. Since the voltage regulators within the build-up layer 435 are separated from the circuits on the die 410 by the distance covered by the connections, which can be on the order of a few tens of microns in length, the lowered-voltage supply can be distributed in a manner minimizing IR and Ldi/dt voltage drops.

In an embodiment, an inductor structure 100 or an inductor array 300 can be coupled to a die 410 by die bonding techniques including flip-chip solder bumps 426, bumpless build-up layer (BBUL), or wire bond. In a BBUL embodiment, the package is built up around the die 410, so the die is contained within the packaging substrate core 415. The die 410 is then connected to a build-up layer 435 and/or input/output (I/O) pins 430 using interconnections 425. The two-dimensional interface and minimal separation distance between a build-up layer 435 and a die 410 helps ensure a further reduction of IR voltage drops and supply bottlenecks when compared to other die bonding techniques.

As illustrated in FIG. 4, the die 410 can be connected directly to I/O pins 430 through interconnects 425 including copper I/O interconnects or thru-vias that transverse the package substrate 405. The interconnects 425 within an integrated circuit package substrate 405 can connect, an inductor structure 100, inductor array 300, a die 410 or other devices to external devices on a motherboard through the I/O pins 430. These I/O pins 430 can include but are not limited to metal leads, solder bumps, or wire in formations such as a pin grid array, a ball grid array, a ceramic column grid array, a leadless grid array, or a land grid array.

Because the build-up layer 435 is positioned in between the I/O pins 430 and the die 410, the build-up layer 435 can be made thin enough to allow a set of thru-vias to penetrate through the layer. The thru-vias are interconnections 425 that traverse the entire build-up layer 435 or packaging core 415, while being insulated from the layer. In an embodiment, the thru-vias are situated around the perimeter of the build-up layer 435 and do not affect the devices contained within the build-up layer 435. An alternative embodiment does not include thru-vias. Instead, the devices in the build-up layer 435 and I/O pins 430 and the die 410 are coupled via I/O interconnect wires that run beyond the edge of the build-up layer 435.

Figure 5A:
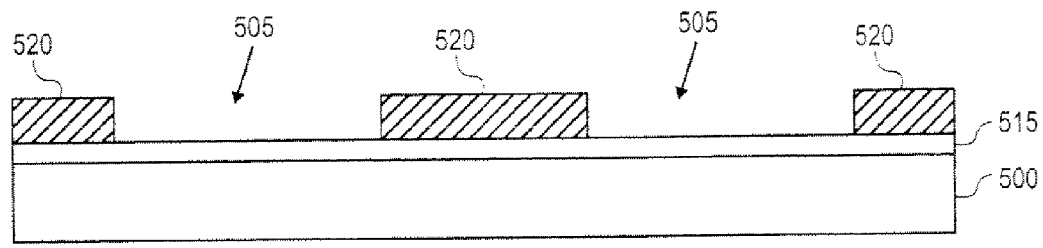
FIG. 5a is an illustration of a cross-sectional view of a seed layer and a photoresist mask formed on a package substrate for the formation of an inductor structure.
Figure 5B:
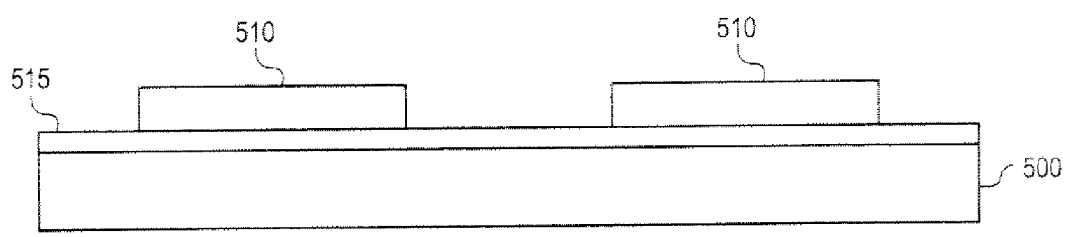
FIG. 5b is an illustration of a cross-sectional view of a package substrate and a conductive layer with a remaining seed layer for forming an inductor structure.
Figure 5C:
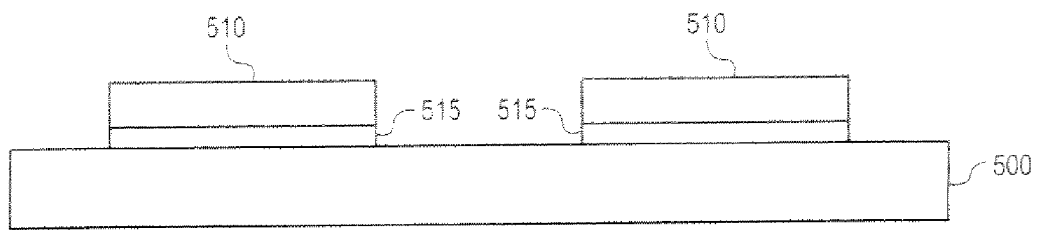
FIG. 5c is an illustration of a cross-sectional view of a package substrate and a conductive layer with a remaining exposed seed saver removed for forming an inductor structure.
Figure 5D:
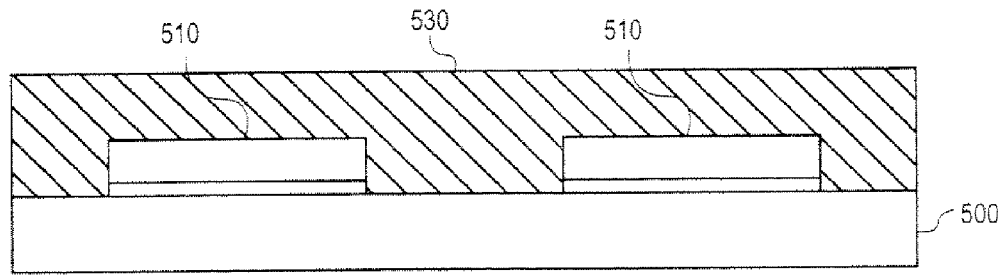
FIG. 5d is an illustration of a cross-sectional view showing a magnetic material formed over a conductive layer and a package substrate for forming of an inductor structure.

One fabrication method of the inductor structure 100 can be achieved through a modified version of a conventional high-density interconnect process as illustrated in FIGS. 5a-5h. FIG. 5a illustrates the formation of the first conductive layer 510 over a substrate 500 such as a printed circuit board by first forming a first seed layer 515 such as a copper seed layer. A technique to form the first conductive layer 510 includes forming a first photoresist mask 520 using well-known masking, exposing, and developing techniques over the substrate 500 to define the location 505 of the first conductive layer 510. In an embodiment, the first conductive layer 510 can be formed of a material such as copper, tungsten, or aluminum. In an embodiment using copper, well-know techniques such as electroplating can be used. The first photoresist mask 520 is removed using well-known techniques to form the structure illustrated in FIG. 5b. The exposed first seed layer 515 is etched away to produce the formation as shown in FIG. 5c. A layer of magnetic material 530 is formed over the package substrate layer 500 and the first conductive layer 510 as illustrated in FIG. 5d.

One method for forming the magnetic material 530 includes laminating many layers of a magneto-dielectric sheet until the desired thickness is achieved. In an embodiment the thickness of the magnetic material can be approximately 30 microns. A second method used to form a magneto-dielectric sheet includes co-sputtering a polymer with a magnetic material. Another method of forming the magnetic material 530 includes alternating layers of magnetic material with insulating material. The combination of the layers helps mitigate the effects of eddy currents when the inductor structure 100 is used at high frequencies of operation. In yet another method, the magnetic material 530 can be formed by sputtering until the desired height of the material 530 is formed. One method of forming the magnetic material 530 includes a step to planarize the magnetic material 530 after the material is deposited.

Figure 5E:
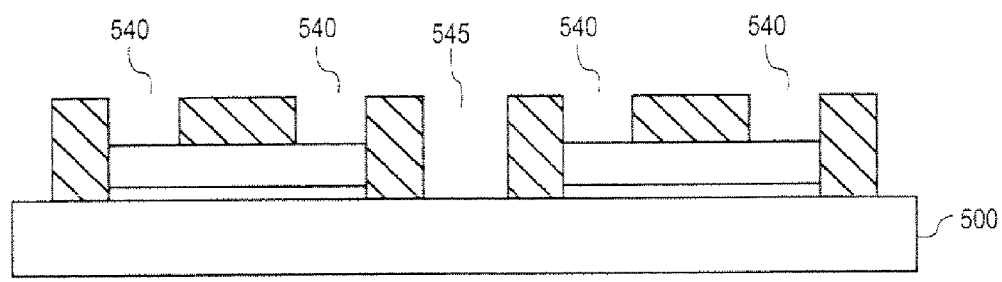
FIG. 5e is an illustration of a cross-sectional view of formed trench regions in a magnetic layer for forming an inductor structure.

Next, as shown in a cross-sectional view in FIG. 5e and the overhead view in FIG. 5e', sidewall trenches 540 and isolation trenches 545 between each inductor structure 100 are formed by etching or typically by laser blazing[HB5] through the magnetic material 530 until the first conductive layer 510 is exposed. In one method, the conductive sidewalls 560 can be formed using vias. These sidewall vias can be formed of copper using well-known plating techniques. One embodiment of the method can employ a series of vias stacked upon each other until the sidewalls 560 are formed through the magnetic layer. Another method employs vias spaced apart from one another at predetermined distances.

Figure 5F:
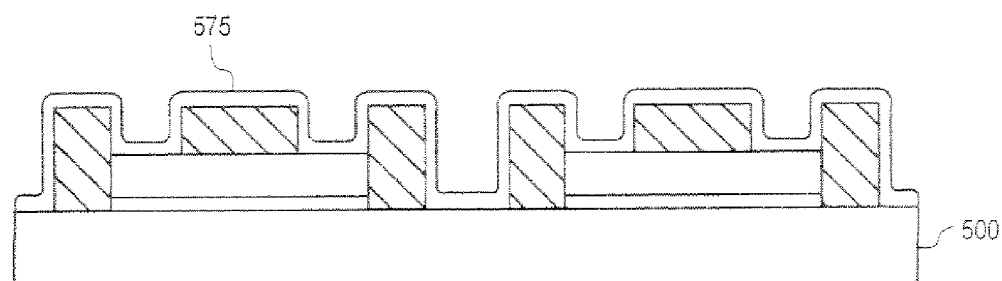
FIG. 5f is an illustration of a cross-sectional view of a second seed layer formed over a magnetic layer and the trench formations for forming an inductor structure.
Figure 5E:
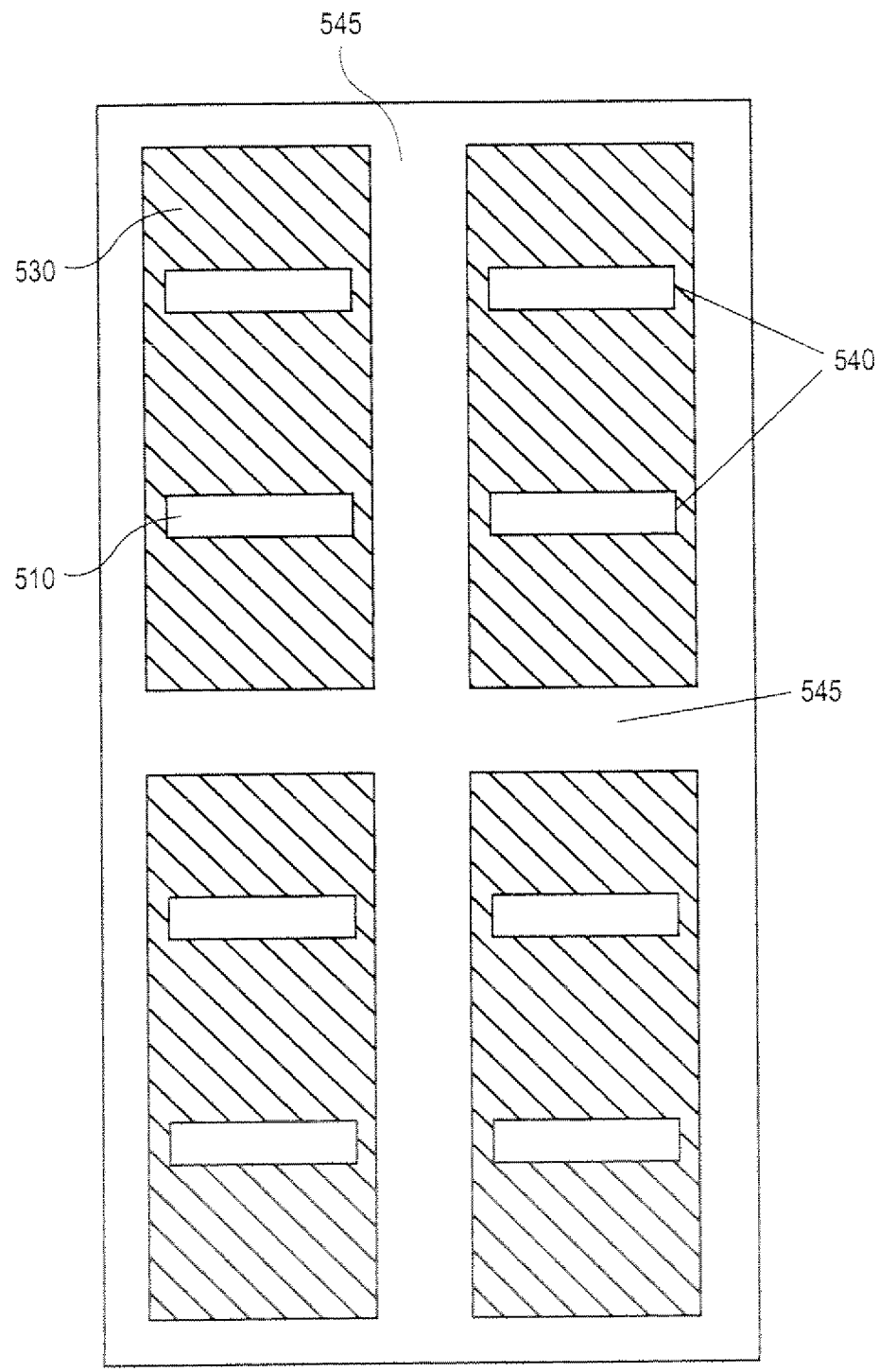
Figure 5G:
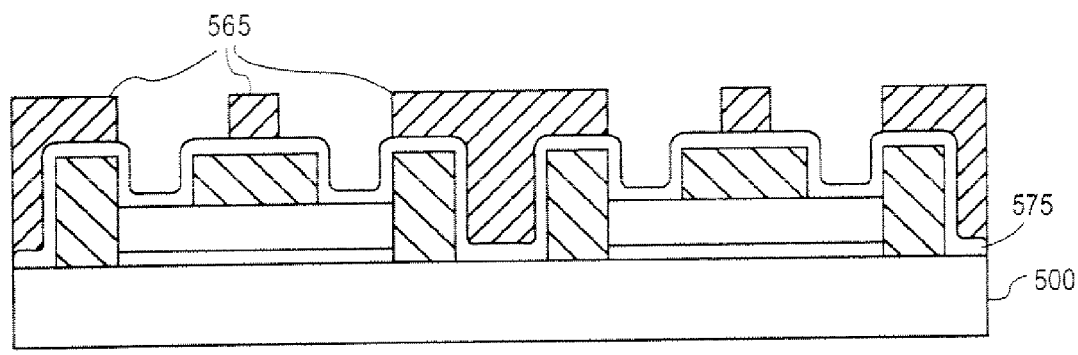
FIG. 5g is an illustration of a cross-sectional view of a second photoresist mask formed over the second seed layer for forming an inductor structure.
Figure 5H:
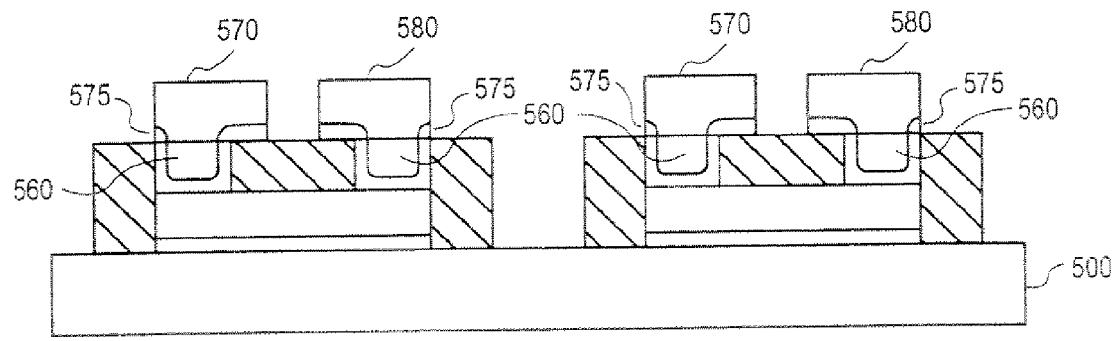
FIG. 5h is an illustration of a cross-sectional view of the formed sidewalls through a magnetic material with a second and third conductive layer formed over the magnetic material for forming an inductor structure.

FIGS. 5f and 5g illustrate a step of one technique used to form the sidewalls 560, the second conductive layer 570, and the third conductive layer 580. As FIG. 5f shows, the first step includes forming a second seed layer 575 over the formation shown in FIG. 5e. Once the second seed layer 575 is formed, a second photoresist mask 565 illustrated in FIG. 5g is formed to define the second conductive layer 570 and the third conductive layer 580 illustrated in FIG. 5h. The second photoresist mask 565 also prevents conductive material from filling the isolation trench 545. The sidewall trenches 540 are then filled with a conductive material to form conductive sidewalls 560 coupled to the first conductive layer 510 as illustrated in FIG. 5h. A second conductive layer 570 is formed over one conductive sidewall 560 such that the second conductive layer 570 is coupled to a conductive sidewall 560. The second conductive layer 570 overlays a portion of the magnetic material 530 toward the other conductive sidewall 560. A third conductive layer 580 is formed to couple with the other conductive sidewall 560. The third conductive layer 580 also covers part of the center portion of the magnetic material 530 as shown in FIG. 5h.

One method incorporates the creation of the second conductive layer 570, third conductive layer 580, and the sidewalls 560 into one step after the formation of a second photoresist mask 565. After the second photoresist mask 565 defines the pattern for the second conductive layer 570 and third conductive layer 580, a conductive material can be formed using well-known techniques such as electroplating. Once the second conductive layer 570, the third conductive layer 580, and the sidewalls 560 are formed, the second photoresist mask 565 can be removed by well-known techniques resulting in the structure shown in FIG. 5h.

In a method to form the inductor structure 100, a dielectric layer is formed over the structure shown in FIG. 5h and within the isolation trench 545. The dielectric layer can be an Ajinomoto buildup film (ABF), a ceramic, or a solder resist. In an embodiment using a solder resist for the dielectric layer, a further step of creating openings in the solder resist layer to expose circular areas of the conductive material of the second conductive layer 570 and the third conductive layer 580 could be used. Once the openings are formed, the openings are then filled with a conductive material. This conductive material can be formed by electrolytic or electroless plating and creates a contact point for interconnecting with other devices.

Figure 6A:
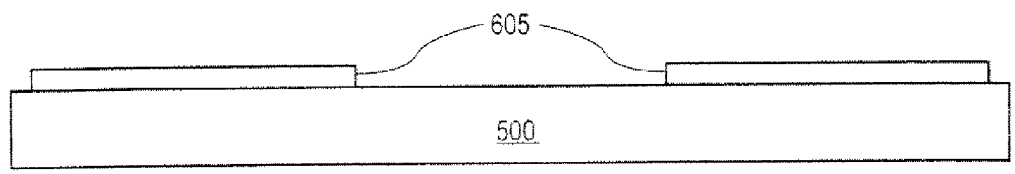
FIG. 6a is an illustration of a cross-sectional view of formed conductive layers over a package substrate for forming an inductor structure.
Figure 6B:
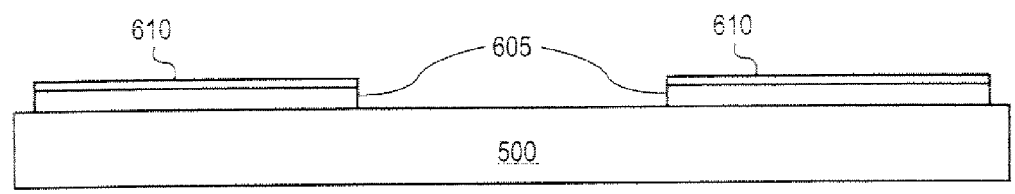
FIG. 6b is an illustration of a cross-sectional view of metal-adhesion layers formed over conductive layers for forming an inductor structure.
Figure 6C:
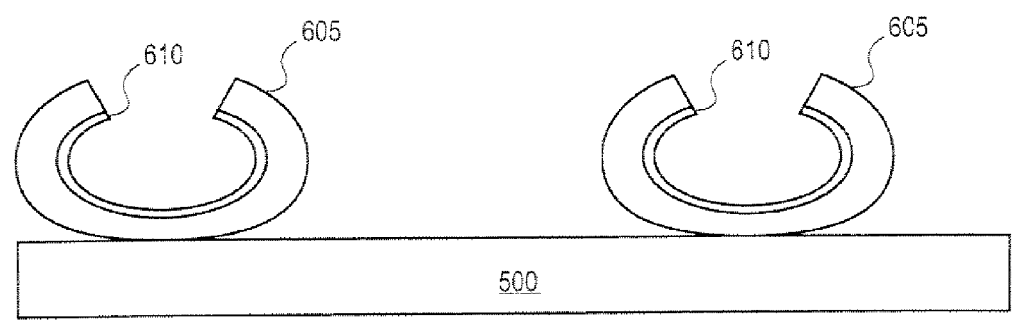
FIG. 6c is an illustration of a cross-sectional view of a bowl shape formed by conductive layers after subjected to thermal stress for forming an inductor structure.
Figure 6D:
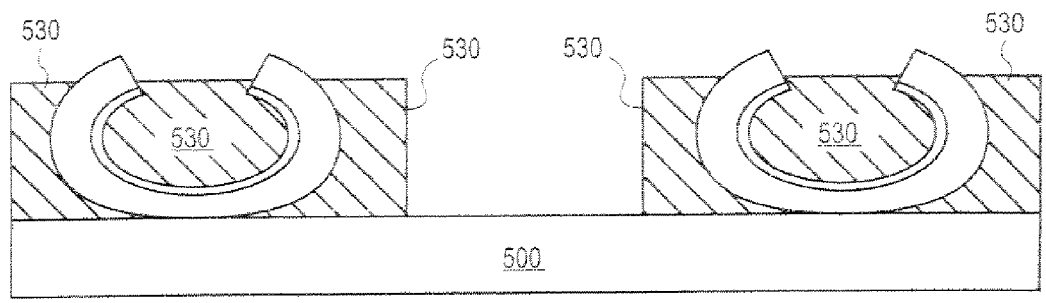
FIG. 6d is an illustration of a cross-sectional view of bowl shaped conductive layers with magnetic material formed within and around the conductive layers for forming an inductor structure.

In another method of fabrication, the conductive layer of the inductor structure 100 is formed in one step, as shown in FIGS. 6a-d. FIG. 6a shows the result of using standard electroplating methods to form a conductive layer 605 over a package substrate 500. A metal-adhesion layer 610 is sputtered on the top of the conductive layer 605 to act as a mechanism to delaminate the conductive layer 605 from the package substrate 500 as shown in FIG. 6b. The metal-adhesion layer 610 is selected to have a greater adhesion with the conductive layer 605 than the adhesion between the conductive layer 605 and the package substrate 500. Subjecting the conductive layer 605 to thermal stresses will delaminate the conductive layer 605 from the package substrate 500. This process forms the conductive layer 605 into a bowl shaped structure as illustrated in 6c. As shown in FIG. 6d, a magnetic material 530 is then formed inside and around the conductive layer 605.

We claim:

1. An inductor comprising:
   a substrate and a single turn solenoid on said substrate, said single turn solenoid comprising:
   a conductor layer on said substrate;
   a magnetic layer over said conductor layer;
   a first conductive sidewall through said magnetic layer to adjoin with said conductor layer such that said magnetic layer is formed around and in contact with all sides of said first conductive sidewall;
   a second conductive sidewall through said magnetic layer to adjoin with said conductive layer such that said magnetic layer is formed around and in contact with all sides of said second conductive sidewall, said first conductive sidewall and said second conductive sidewall having a portion of said magnetic layer there between;
   a first conductive layer on said first conductive sidewall and on said magnetic layer; and
   a second conductive layer on said second conductive sidewall over said magnetic layer.

2. The inductor of claim 1 wherein said first conductive sidewall and second conductive sidewall are formed by vias.

3. The inductor of claim 2 wherein said conductive layer, said first conductive sidewall, said second conductive sidewall, said first conductive layer, and said second conductive layer are formed of copper.

4. The inductor of claim 3 wherein said magnetic layer is a soft magnetic material having a permeability of approximately 95-900.

5. The inductor of claim 1 wherein said magnetic layer is composed of a plurality of magnetic granules in a polymer host.

6. The inductor of claim 1 wherein said single turn solenoid has a central axis which is parallel to said substrate.

7. An inductor structure included in an inductor array comprising:
   a magnetic material divided into a plurality of sections on a substrate; and
   a plurality of single turn solenoids each comprising a first and a second conductive sidewall, wherein each single turn solenoid is circumscribed by one of said plurality of sections so that a portion of magnetic material is formed within and around and in contact with all sides of the first and second sidewalls of each of said single turn solenoids.

8. The inductor array of claim 7 wherein said plurality of sections are separated from each other by a dielectric material.

9. The inductor array of claim 7 formed in a build-up-packaging layer of an integrated circuit package.

10. The inductor array of claim 9 wherein one of said plurality of single turn solenoids is coupled to an integrated circuit device.

11. The inductor array of claim 7 wherein each of said single turn solenoids has a central axis which is parallel to said substrate.

12. An inductor structure formed into an array comprising:
    a plurality of conductor layers;
    a plurality of magnetic layers formed over said conductor layers;
    a plurality of conductive sidewall pairs formed through said plurality of magnetic layers and coupled to said plurality of conductor layers and to define a magnetic core between each of said plurality of conductive sidewall pairs and around and in contact with all sides of each pair of said plurality of conductive sidewall pairs; and
    a plurality of conductive layer pairs coupled to each of said plurality of conductive sidewall pairs to partially cover said magnetic core.

13. The inductor structure formed into an array of claim 12 further comprising dielectric material formed to isolate each of said plurality of magnetic layers.

14. The inductor structure formed into an array of claim 13 wherein said dielectric material is selected from a group consisting of an Ajinomoto buildup film (ABF), a ceramic and a solder resist.

15. The inductor structure formed into an array of claim 12 formed within a build-up layer of an integrated circuit package substrate.

16. The inductor structure formed into an array of claim 13 coupled to power conversion circuitry.

17. The inductor structure formed into an array of claim 12 wherein said plurality of conductor layers are formed over a substrate and wherein said plurality of conductor layers and said plurality of conductive sidewall pairs form a plurality of single turn solenoids each having a central axis parallel to said substrate.

* * * * *